United States Patent
Etou et al.

[19]

[11] Patent Number: 5,915,179
[45] Date of Patent: Jun. 22, 1999

[54] SEMICONDUCTOR DEVICE AND METHOD OF MANUFACTURING THE SAME

[75] Inventors: Hiroki Etou; Kazunori Ohno; Takaaki Saito, all of Ora-Gun; Naofumi Tsuchiya, Ohta; Toshinari Utsumi, Ashina-Gun, all of Japan

[73] Assignee: Sanyo Electric Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/660,479

[22] Filed: Jun. 7, 1996

[30] Foreign Application Priority Data

Jun. 9, 1995 [JP] Japan .................................. 7-143369
May 28, 1996 [JP] Japan .................................. 8-133807

[51] Int. Cl.$^6$ ..................................................... H01L 29/78
[52] U.S. Cl. ......................... 438/268; 438/268; 438/570; 438/572; 438/582; 257/484; 257/486
[58] Field of Search ..................................... 257/484, 342, 257/751, 486, 766; 438/268, 570, 582, 572

[56] References Cited

U.S. PATENT DOCUMENTS

| | | | |
|---|---|---|---|
| 3,368,124 | 2/1968 | Ditrick | 257/766 |
| 3,694,719 | 9/1972 | Saxena | 317/234 |
| 3,737,742 | 6/1973 | Breuer et al. | 257/486 |
| 3,891,479 | 6/1975 | Zwernemann | 257/484 |
| 4,811,065 | 3/1989 | Cogan | 357/234 |
| 4,823,172 | 4/1989 | Mihara | 257/144 |
| 4,859,616 | 8/1989 | Losehand | 437/39 |
| 4,967,243 | 10/1990 | Baliga et al. | 257/342 |
| 5,164,802 | 11/1992 | Jones et al. | 257/337 |
| 5,338,961 | 8/1994 | Lidow et al. | 257/342 |

FOREIGN PATENT DOCUMENTS 7-15009  1/1995  Japan .

OTHER PUBLICATIONS

T.M. Reith, et al., "Al/PtSi Schottky Barrier Diodes with a Diffusion Barrier," IBM Technical Disclosure Bulletin, vol. 16, No. 11, p. 3586, Apr. 1974.

R. P. Sopher, et al., "Metal Contacts to Semiconductor Devices," IBM Technical Disclosure Bulletin, vol. 10, No. 2, Jul. 1967, p. 158.

T. M. Reith, et al., "Al/PtSi Schottky Barrier Diodes with a Diffusion Barrier," IBM Technical Disclosure Bulletin, vol. 16, No. 11, Apr. 1974, p. 3586.

*Primary Examiner*—Donald L. Monin, Jr.
*Assistant Examiner*—Michael Dietrich
*Attorney, Agent, or Firm*—Loeb & Loeb LLP

[57] ABSTRACT

In the present invention, a vertical type MOSFET and a Schottky barrier diode which are used as a switching device of a DC—DC converter are formed on the same semiconductor substrate. Further, a barrier metal which is required for the Schottky barrier diode is also formed on an electrode portion of the vertical type MOSFET. In addition, a Schottky barrier diode forming region is formed to have low impurity concentration than a vertical type MOSFET forming region.

2 Claims, 12 Drawing Sheets

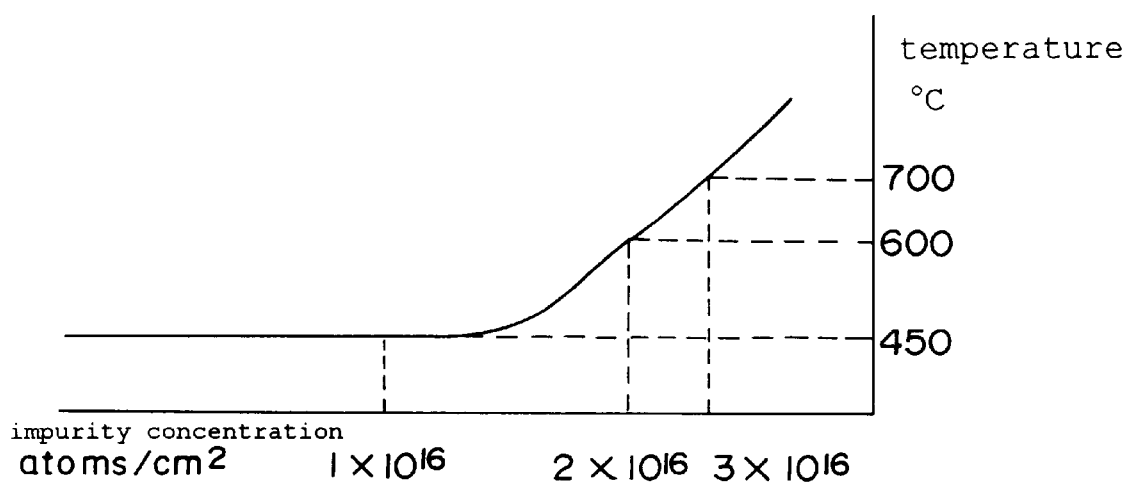

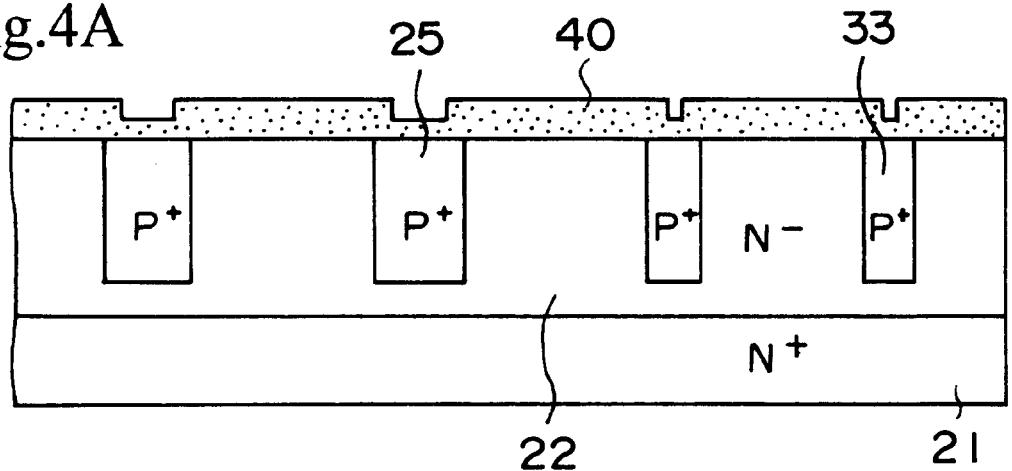
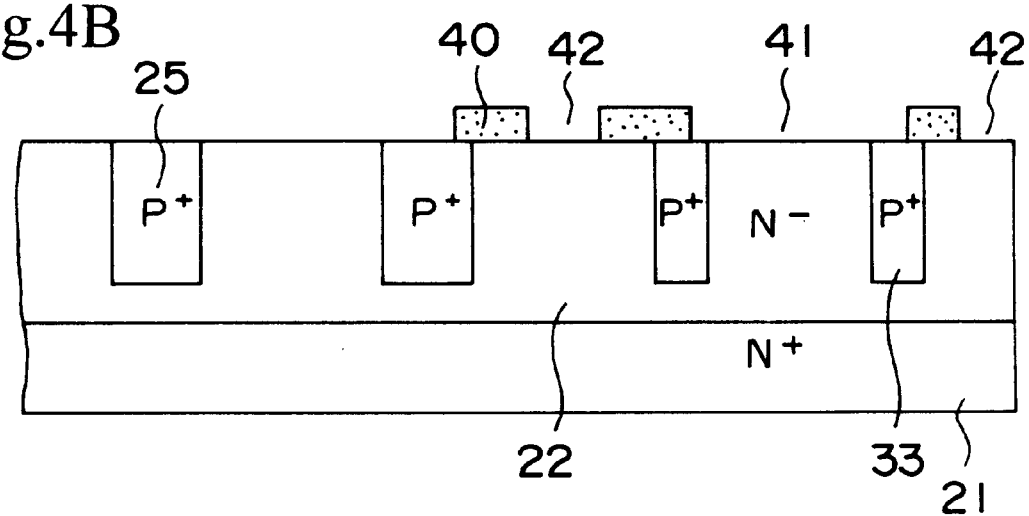

SEMICONDUCTOR DEVICE AND METHOD OF MANUFACTURING THE SAME

BACKGROUND OF THE INVENTION

1. Field of the Invention

The present invention relates to a semiconductor device wherein a vertical type power MOSFET and a Schottky barrier diode are integrated on a common semiconductor chip and a method of manufacturing the same.

2. Description of the Prior Art

As shown in FIG. 1A, a vertical type power MOSFET device is so formed that a plurality of $P^+$ type base regions 2 are formed on a surface of an $N^-$ type layer 1 of an $N^+/N^-$ substrate, an $N^+$ type source region 3 is formed on a surface of the base regions 2, a gate electrode 4 is formed over a channel region in the base regions 2, and a source electrode 5 is formed to make ohmic contact with both the base regions 2 and the source region 3. Such power MOSFET device has excellent features such as simple circuit configuration in contrast to a bipolar device, so that it has been employed particularly as a switching device (for instance, see Patent Application Publication (KOKAI) 7-15009).

As one of applications of the power MOSFET device, a switching device used in a DC—DC converter, for example, can be considered. As shown in FIG. 1B, in the switching device used in the DC—DC converter, a collector of a PNP transistor 7 and a drain of an N channel MOSFET device 8 are connected commonly, and the PNP transistor 7 and the $N^-$ channel MOSFET device 8 are alternately turned ON/OFF. Where a reference 9 denotes a parasitic diode which is formed parasitically by PN junction between the $P^+0$ type base region 2 and the $N^-$ type layer 1.

In the circuit wherein alternate ON/OFF operations would be repeated, a so-called reverse recovery time becomes an issue when the $N^-$ channel MOSFET device 8 is transferred from an OFF state to an ON state since current flows from a coil (not shown) connected to a current path via a capacitor (not shown) and the parasitic diode 9 in the $N^-$ channel MOSFET device 8, for example, when the PNP transistor 7 is in an OFF state.

This reverse recovery time is defined as a time required for discharging completely carriers (electrons) accumulated in the $N^-$ type layer 1 via the parasitic diode 9 to recover the PN junction of the parasitic diode 9. Thus, the $N^-$ channel MOSFET device 8 cannot turn ON during the reverse recovery time even if an ON signal is applied to a gate of the $N^-$ channel MOSFET device 8. As a result, an all over switching time of the circuit cannot be improved due to such reverse recovery time.

For this reason, as shown in FIG. 1C, a Schottky barrier diode (SBD) 10 is connected parallel to the parasitic diode 9. By falling down the drain potential of the $N^-$ channel MOSFET device 8 quickly to the source potential based on the fact that a forward voltage VF of the SBD 10 is lower than the PN diode 9, it is intended to improve the all over switching time of the circuit.

However, if the above circuit is constituted by discrete devices, the number of parts is increased to thus disturb miniaturization of the electronic devices. Hence, although the case has been considered where the FET chip and the SBD chip are mounted in one package, several problems have arisen. By way of example, these chips would be wasted if the number of good quality parts of the FET chip disagrees with that of the SBD chip since these chips are manufactured by employing independent wafers, and also assembling process of these chips would become complicated.

In the event that the FET and the SBD are formed by discrete devices to overcome the above problems, there is caused a problem that, since the FET and the SBD are mounted on the substrate and then conductive patterns or connecting the FET to the SBD are formed on the substrate, the conductive patterns acts as noise generating sources to badly influence their peripheral circuits.

SUMMARY OF THE INVENTION

An object of the present invention is to provide a semiconductor device capable of lessening a reverse recovery time by reducing a forward current to a parasitic diode built in a vertical type power MOSFET device when the MOSFET device performs switching operation, and achieving various improved characteristics.

According to the present invention, since the vertical type MOSFET and the Schottky barrier diode serving as a switching device in a DC—DC converter are formed on the same semiconductor substrate, a reverse recovery time can be shortened by supplying the forward current to Schottky barrier diode and reducing the forward current to the parasitic diode built in the vertical type power MOSFET device when the MOSFET device performs switching operation, and a switching speed of the MOSFET can be improved, and also circuit configurations of the electronic devices can be facilitated.

In addition, since the barrier metal required for the Schottky barrier diode is also formed in the electrode portion of the vertical type power MOSFET device, alloy spike and silicon nodule can be suppressed. As a result, reliability of the vertical type power MOSFET device can be improved, and also miniaturization of the device can be attained.

Furthermore, since impurity concentration of the semiconductor layer of one conductivity type is lowered, a Schottky barrier can be obtained readily by means of low temperature annealing and also leakage current flowing through the Schottky barrier diode can be reduced.

Moreover, since impurity concentration in the Schottky barrier diode forming region is set to be low rather than that of the MOSFET forming region, impurity concentration in the Schottky barrier diode can be further reduced without effecting the MOSFET characteristics, and a Schottky barrier can be implemented at a lower temperature.

BRIEF DESCRIPTION OF THE DRAWINGS

FIG. 3 is a characteristic view illustrating a relation between impurity concentration in an N type silicon and an annealing temperature when a Schottky barrier is formed between nickel and the N type silicon;

FIGS. 4A to 4M are sectional views illustrating a manufacturing method of the semiconductor device according to the first embodiment of the present invention;

DESCRIPTION OF THE PREFERRED EMBODIMENTS

There will be explained preferred embodiments of the present invention in detail hereinafter with reference to the accompanying drawings.

Figure 2A:
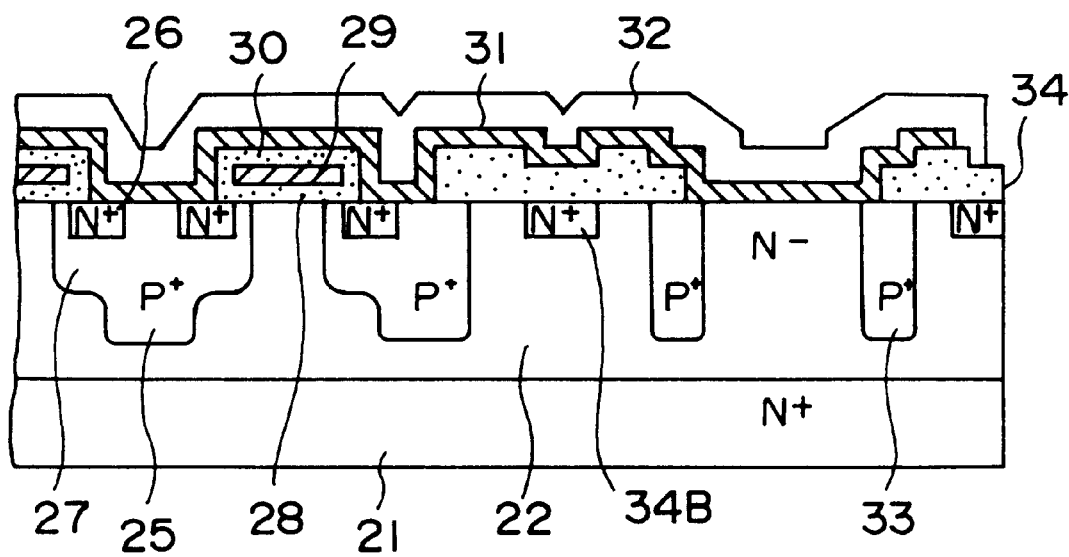
FIG. 2A is a sectional view showing a semiconductor device according to a first embodiment of the present invention.

As shown in FIG. 2A, in a semiconductor device according to a first embodiment of the present invention, an $N^+/N^-$ semiconductor substrate 21 is comprised of an $N^-$ type epitaxial layer formed on an N type substrate or an $N^+$ type layer formed on an $N^-$ type substrate using diffusion techniques. A power MOSFET device 23 and a Schottky barrier diode device (referred to as a "SBD device" hereinafter) 24 are formed on a surface of an $N^-$ type layer 22. By forming the power MOSFET device 23 and the Schottky barrier diode device 24 in combination, devices each having the desired current capacity can be formed as one chip device.

In the MOSFET device 23, the $N^-$ type layer 22 is used as a common drain, a plurality of $P^+$ type base regions 25 are then formed on a surface of the $N^-$ type layer 22, and an $N^+$ type source region 26 is then formed on a surface of the $P^+$ type base regions 25. The $P^+$ type area in the $P^+$ type base regions 25 put between the source region 26 and the $N^-$ type layer 22 is used as a channel region 27. A polysilicon gate electrode 29 is then formed over the channel region 27 via a gate oxide film 28. Both a barrier metal 31 and an aluminum electrode 32 are come in ohmic contact with the $P^+$ type base region 25 and the $N^+$ type source region 26 via a contact hole which is formed in a PSG (phosphosilicate glass) oxide film 30 covering the polysilicon gate electrode 29.

In the SBD device 24, the $N^-$ type layer 22 is used as a cathode, and a $P^+$ type guard ring region 33 is then formed on a surface of the $N^-$ type layer 22. A Shottky barrier is formed between the barrier metal 31 and the surface of the $N^-$ type layer 22 via an opening of oxide film, a periphery of which is aligned just on the $P^+$ type guard ring region 33. An aluminum electrode 32 is formed thereon.

The aluminum electrode 32 formed of pure aluminum or aluminum/silicon alloy serves as a source electrode to connect a plurality of source regions 26 in parallel in the MOSFET device 23 while it also serves as an anode electrode in the SBD device 24.

Figure 2B:
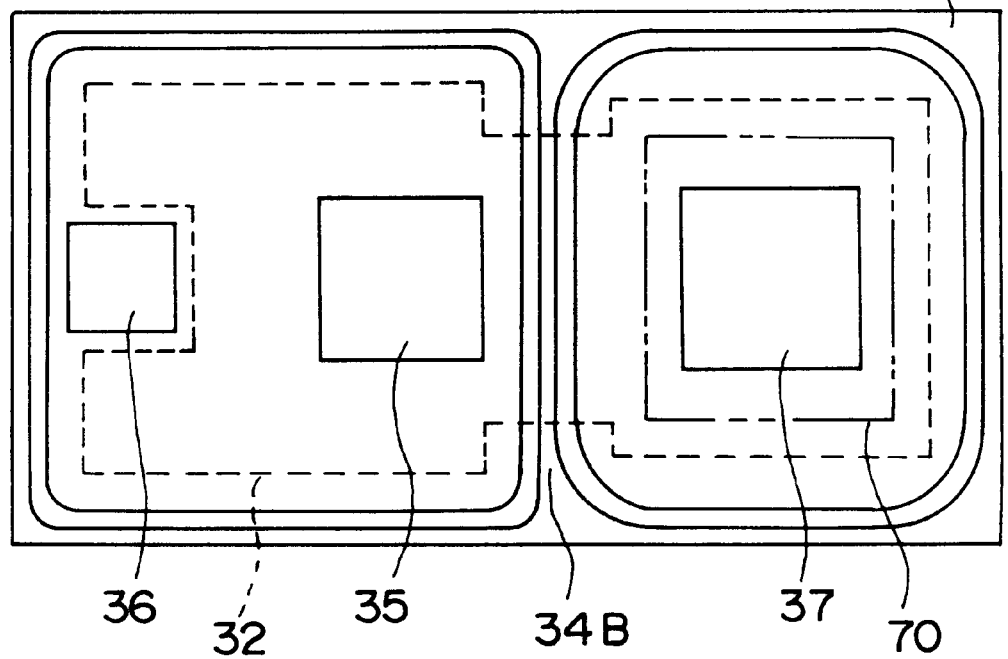
FIG. 2B is a plan view showing the semiconductor device according to the first embodiment of the present invention.

FIG. 2B is a plan view showing an all over semiconductor chip according to the first embodiment. Although not shown in FIG. 2B, the gate electrode 29 is formed to have a lattice pattern, and the $P^+$ type base regions 25 are formed to have island patterns which are located respectively in mesh portions of the lattice pattern.

On the contrary, it would be understood that the gate electrodes 29 may be formed as island patterns and the $P^+$ type base region 25 may be formed as the lattice pattern. Respective mesh portions in the lattice pattern act as unit MOS cell, so that the MOSFET region 23B is termed as a region wherein the MOS cell are formed.

Conversely, in the SBD device 24, the guard ring region 33 has an annular pattern, and a Shottky barrier is formed between the barrier metal 31 and the surface of the $N^-$ type layer 22 in an inner area of the annular pattern. The SBD region 24B is termed as a region including the guard ring region 33.

A channel stopper region 34 is formed around the semiconductor chip so as to surround the MOSFET region 23B and the SBD region 24B. The channel stopper region 34 is extended to the region between the MOSFET region 23B and the SBD region 24B. The channel stopper region 34B located between the MOSFET region 23B and the SBD region 24B acts to suppress the generation of a parasitic PNP transistor which is formed of the $P^+$ base region 25, the $N^-$ type layer 22, and the $P^+$ guard ring region 33.

The aluminum electrode 32 for connecting the source regions 26 in parallel is covered with a silicon nitride film (not shown) serving as a final passivation film. The opening formed in the silicon nitride film is a bonding pad. The aluminum electrode 32 formed on the MOS cell in the MOSFET region 23 serves as a source electrode pad 35. A gate electrode pad 36 may be formed by extending polysilicon material for the polysilicon gate electrode 29 to the chip peripheral portion, and then contacting the aluminum electrode with the polysilicon material. The gate electrode pad 36 is electrically independent from the aluminum electrode 32 serving as the source electrode. The barrier metal 31 is not especially required between the polysilicon layer and the aluminum material.

The barrier metal 31 and the aluminum electrode 32 are extended to the SBD region 24B beyond the channel stopper region 34B. The anode electrode pad 37 is provided by forming an opening in part of the silicon nitride film formed on the aluminum electrode 32. For the purpose of reducing electric resistance and enhancing thermal coupling described later, the aluminum electrode 32 over the channel stopper region 34B is formed to have a wide line width as much as possible, for example, a line width larger than a width of the electrode pads 35, 37.

In the present invention, the barrier metal 31 is made up of a titanium (Ti) layer having a film thickness of several hundreds angstroms and a nickel (Ni) layer having a film thickness of several thousands angstroms formed on the titanium layer. Nickel is used to form a Schottky barrier, and titanium is interposed between the silicon and the nickel to prevent peeling off of the nickel from the silicon.

Alloying of these two kinds of metals is facilitated by indispensable annealing to form a Schottky barrier during manufacturing steps, so that a border between these two metals becomes indefinite. Nickel has a barrier (φB) of 0.64 eV against silicon. In this connection, it may be said that, since titanium (Ti) has the barrier (φB) of 0.5 eV and molybdenum (Mo) has the barrier (φB) of 0.68 eV, they can also be used as a barrier metal. However, titanium has such a drawback that it has a large reverse current IR in contrast to nickel, while molybdenum has such a drawback that it has a large forward voltage VF in comparison with nickel. Chromium (Cr) and vanadium (V) may be considered as a candidate for an available metal which has the barrier (φB) to the same extent as that of nickel other than these two metals.

The barrier metal 31 acting as the Schottky barrier in the SBD region 24B makes ohmic contact with both the P$^+$ type base region 25 and the N$^+$ type source region 26 in the MOSFET region 23B. This ohmic contact can be derived from annealing process to form a Schottky barrier in the SBD device 24. Since surface concentration of the P$^+$ type base region 25 is on the order of about $10^{18}$ cm$^3$ and surface concentration of the N$^+$ type source region 26 is on the order of about $10^{20}$ cm$^3$, a Schottky barrier cannot be formed between the P$^+$ type base region 25 and the N$^+$ type source region 26, but ohmic contact can be formed between them.

As stated above, since the barrier metal 31 is formed into the MOSFET device 23 according to the present invention, such advantageous merits can be achieved in the MOSFET device 23 that alloy spike can be prevented and precipitation of silicon nodule can also be prevented. With respect to these advantages, explanation will be given in the following.

As the result of facilitating miniaturization of the circuit in recent years, a very severe design dimension is permitted like about 1 to 3 $\mu$m between an end of the contact hole provided in the source region and an end of the source region 26 in the channel region 27 side, and also a diffusion depth of the N$^+$ source region 26 is suppressed less than 1.0 $\mu$m.

Under this condition, if pure aluminum is contacted with the N$^+$ type source region 26, for example, not only is the N$^+$ type source region 26 penetrated by alloy spikes but also the annular pattern of the N$^+$ type source region 26 is disconnected partially. Since partial disconnection of the pattern causes different source current every MOS cell, the balance of current is disturbed in all MOS cells to occur degradation in breakdown voltage because of current concentration. Even in aluminum/silicon alloy in which few alloy spikes occur, it cannot be ensured that such situation will not be brought about.

Silicon nodule is defined as a phenomenon that silicon included in the N$^-$ type layer 22 is separated as an insulator into the contact hole contacting to aluminum to therefore reduce an effective area of the contact area. Since the power MOSFET flows large current rather than the MOSLSI, contact resistance varies cell by cell due to precipitation of silicon nodule even if the contact hole has a size of about 5 $\mu$m×5 $\mu$m. Therefore, ON-state resistance is increased and in addition the balance of FET operation condition is not maintained, which results in degradation in the breakdown voltage.

However, according to the present invention, since silicon cannot migrate because of the barrier metal 31 contacted with the silicon layer, precipitation of silicon nodule can be prevented and therefore imbalance of FET operation condition can be prevented.

As mentioned earlier, according to the present invention, generation of alloy spike and precipitation of silicon nodule can be prevented by the barrier metal 31 to achieve the MOSFET device 23 with high reliability. Another advantage is that inexpensive pure aluminum can be used on the barrier metal 31. Of course, it is needless to say that aluminum/silicon alloy may be used in the light of workability, etc. If there is enough margin in design dimension of the MOS cell so as not to need the prevention of alloy spike and silicon nodule, the barrier metal 31 must not be always formed within the source contact hole. In this case, the aluminum electrode 32 can be made directly ohmic contact with the surface of the N$^+$ type source region 26 and the P$^+$ type base region 25.

Meanwhile, a Schottky barrier can be readily formed in refractory metal such as nickel since the refractory metal has high barrier rather than aluminum. But it is influenced by both impurity concentration of the N$^-$ type layer 22 serving as the cathode and annealing temperature for the barrier metal 31. There will be explained how these conditions are set in the present invention hereinbelow.

FIG. 3 is a characteristic view illustrating a relation between impurity concentration in an N type silicon and an annealing temperature when a Schottky barrier is formed between nickel and the N type silicon. It would be evident from FIG. 3 that, even if impurity concentration of the N$^-$ type layer 22 is increased, a Schottky barrier can be obtained by increasing annealing temperature. The N$^-$ type layer 22 in the MOSFET device 23 is an important factor for determining ON-state resistance of the device. If impurity concentration is higher, ON-state resistance can be reduced although depending upon the breakdown voltage. However, according to study of the inventor of the present invention, it becomes clear that another new problem has arisen due to high temperature processing in the structure of the present invention wherein the insulating film is covered with the barrier metal 31.

More particularly, in the MOSFET device 23, the gate electrode 29 is covered with the PSG film 30 to prepare for getting process for the gate electrode 29 and the gate oxide film 28 thereunder. In the structure wherein the N$^+$ type source region 26 and refractory metal such as the barrier metal 31 are contacted, if high temperature heat treatment is applied, phosphorus or arsenic as impurity in the N$^+$ type source region 26 is separated into the interface between the barrier metal and the N$^+$ type source region 26 as black shades to result in a defect in the external appearance.

In addition, in case a manufacturing apparatus is employed wherein chip locations can be automatically recognized based on difference in polarization factor of the oxide film patterns, there is caused a drawback such that automatic recognition cannot be implemented because of such black shades.

Such precipitation can be prevented if aluminum contacts with the N$^+$ type source region 26. As the result of earnest study by the inventor of the present invention, it has been found that the above phosphorus precipitation phenomenon occurs frequently according to heat treatment at a temperature of more than 700° C. It is perfectly sure that such phenomenon never occurs at a temperature of 600° C. In view of the characteristic shown in FIG. 3, since impurity concentration capable of producing a Schottky barrier by heat treatment at a temperature of less than 700° C. is $3\times10^{16}$/cm$^3$ a Schottky barrier can be formed while preventing the phosphorus precipitation phenomenon if impurity concentration of the N$^-$ type layer 22 is set to a value of less than $3\times10^{16}$/cm$^3$.

Because the aluminum electrode 32 is formed on the barrier metal 31, additional annealing process (i.e., heat treatment at 350 to 550° C.) is negligible. Impurity concentration of the N$^-$ type layer 22 as well as ON-state resistance can be achieved in the MOSFET device 23. In other words, the present invention can easily form a Schottky barrier by adjusting impurity concentration of the N$^-$ type layer 22 to impurity concentration required for the SBD device 24.

Moreover, the present invention can also have such an advantage that, since reduction in impurity concentration of the N$^-$ type layer 22 results in increase in the reverse voltage VR in the SBD device 24, reverse leakage current in the diode can be reduced. With the above reasons, impurity concentration of the N$^-$ type layer 22 has been suppressed low less than $3\times10^{16}$/cm$^3$.

Figure 4D:
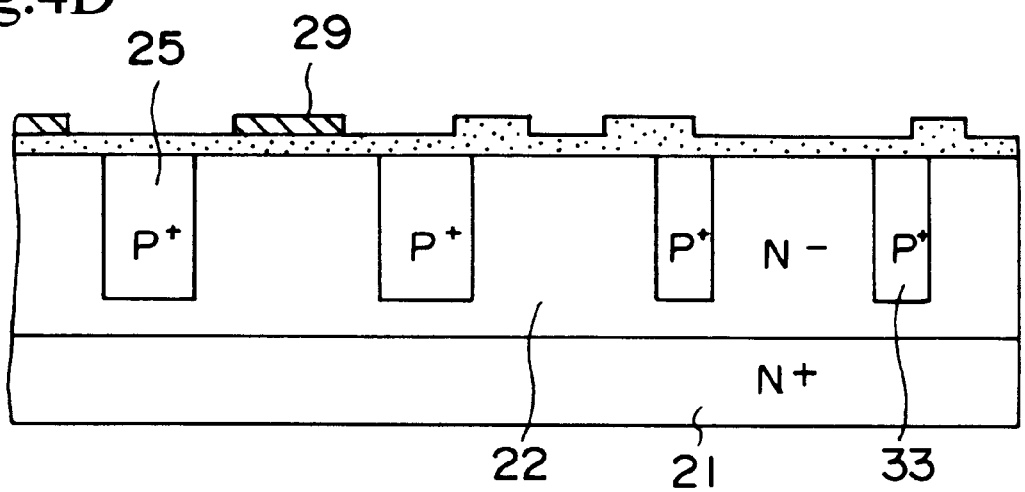

Next, a manufacturing method of the semiconductor device will be explained with reference to FIGS. 4A to 4M hereinbelow. As shown in FIG. 4A, first a substrate 21 including the N⁻ type layer 22 having impurity concentration of $2\times10^{16}$ /cm$^3$ is prepared, an oxide film 40 is then formed by thermally oxidizing a surface of the N⁻ type layer 22, a photoresist mask is then formed thereon, the oxide film 40 is then patterned, and the P⁺ type base region 25 in the MOSFET device 23 and the P⁺ type guard ring region 33 in the SBD device 24 are then formed simultaneously by means of selective diffusion of boron. It would be understood that manufacturing process can be simplified because the same manufacturing step is shared to form the P⁺ type base region 25 and the P⁺ type guard ring region 33.

Subsequently, as shown in FIG. 4B, a photoresist is formed on the oxide film 40 to form resist masks, the oxide film 40 is selectively removed by virtue of the resist masks to expose an active region of the MOSFET region 23B. At this time, it is preferable that, because the oxide film 40 having a uniform film thickness is used, the oxide film 40 in both the contact hole area 41 for a Schottky barrier and the channel stopper region forming area 42 within the SBD region 24B is also removed so as to facilitate formation of the contact hole or diffusion region in succeeding steps.

As shown in FIG. 4C, an exposed surface of the N⁻ type layer 22 is thermally oxidized again to then form the clean gate oxide film 28 of several hundreds angstrom thick.

As shown in FIG. 4D, a non-doped polysilicon layer is formed by a CVD method to have a film thickness of 5000 to 7000 angstrom on an all over surface of the resultant structure. The gate electrode 29 is then formed by patterning the polysilicon layer.

Figure 4E:
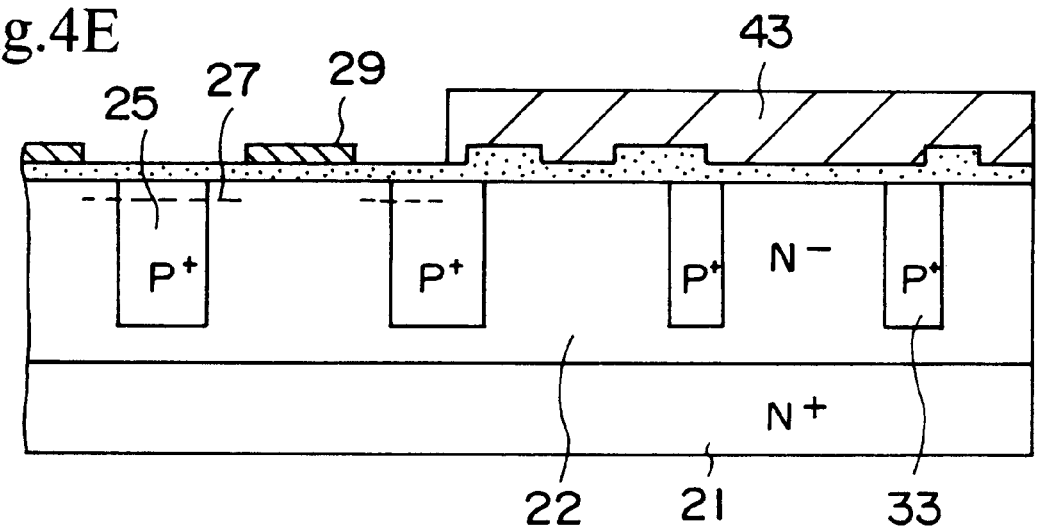

As shown in FIG. 4E, a photoresist film 43 is formed on the regions except for an active region in the MOSFET device 23. Boron ions are injected by virtue of ion implantation using the gate electrode 29 as a mask to form the channel region 27 in the P⁺ type base region 25.

Figure 4F:
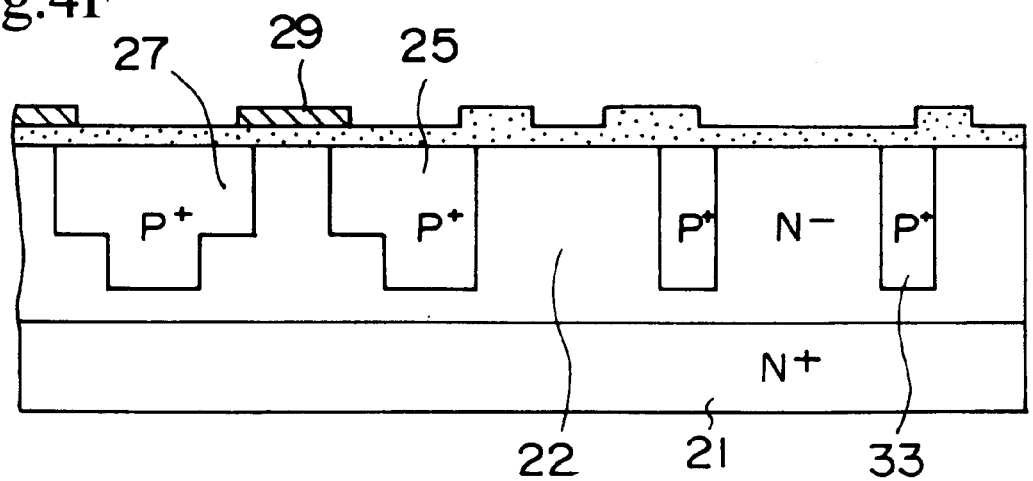

As shown in FIG. 4F, the photoresist film 43 is removed, and then boron ions are activated and diffusion of the P⁺ type channel region 27 is extended by applying heat treatment to the entire substrate in non-oxidative atmosphere.

Figure 4G:
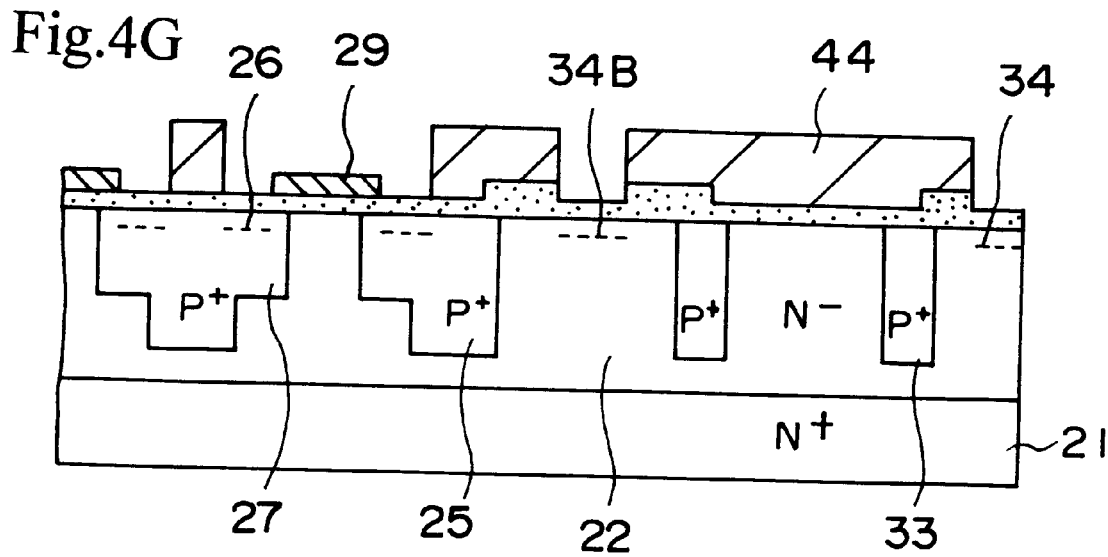

As shown in FIG. 4G, a photoresist layer 44 is formed to cover an entire region of the SBD device 24 and a center region of the P⁺ type base region 25. The N⁺ type source region 26 and the N⁺ type channel stopper region 34 are formed by injecting phosphorus or arsenic by means of ion implantation. Manufacturing process can be simplified because the same manufacturing step is shared to form the N⁺ type source region 26 and the N⁺ type channel stopper region 34.

Figure 4H:
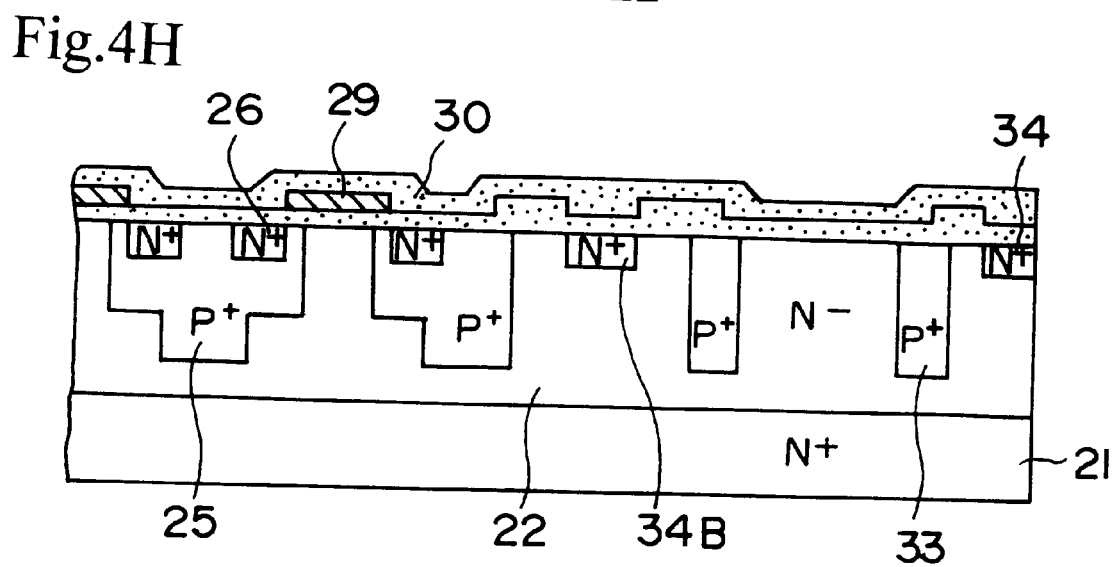

As shown in FIG. 4H, phosphorus-doped silicon oxide film, i.e., PSG film 30 of about 1 μm thick is formed on the entirety of the resultant structure by a CVD method. Thereafter, the PSG film 30 is subjected to baking by way of heat treatment at 1000° C. for several tens minute. Ions implanted in the source region 26 and the channel stopper region 34 are activated by such heat treatment to thus extend diffusion therein.

Figure 4I:
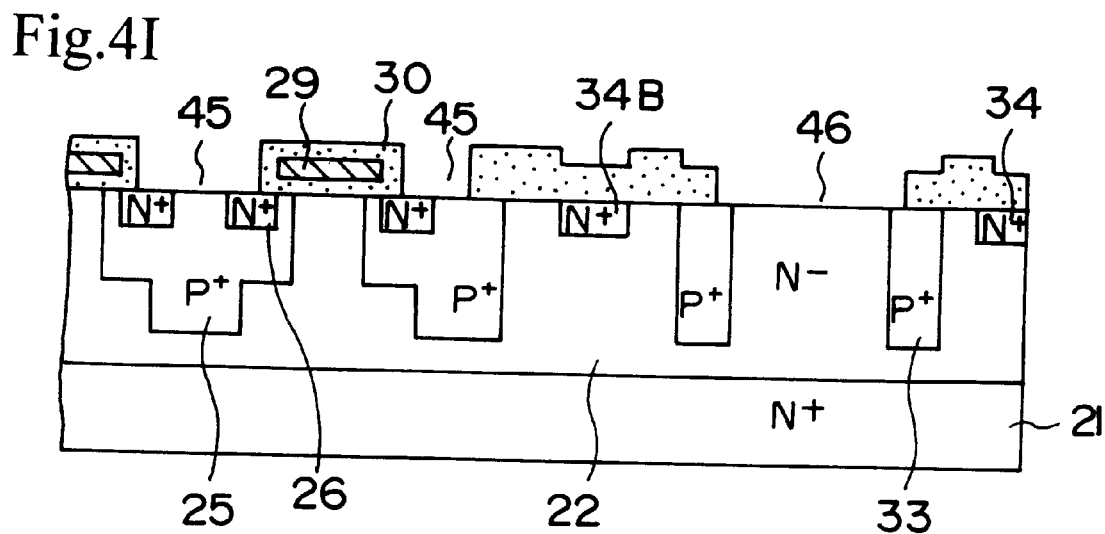

As shown in FIG. 4I, after a resist film is formed and patterned to form a mask, the PSG film 30 is selectively removed using the resist mask by means of wet etching using HF as etchant or dry etching such as RIE, so that the contact hole 45 for the source electrode and the contact hole 46 for a Schottky barrier are formed.

Figure 4J:
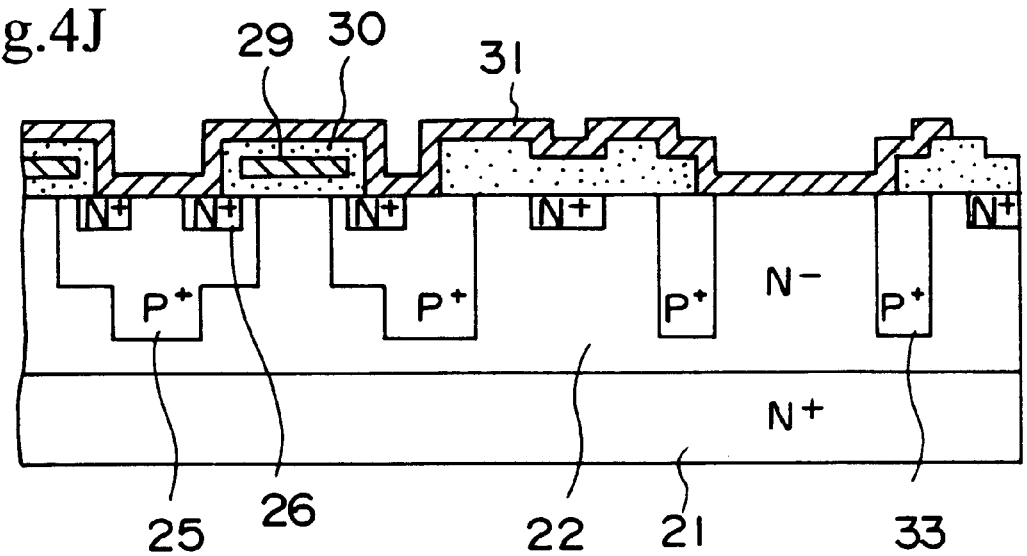

As shown in FIG. 4J, the titanium layer of several hundreds angstrom thick and the nickel layer of several thousands angstrom thick are formed sequentially on an entire surface of the resultant structure by a sputtering method. The barrier metal 31 is formed by patterning these layers so as to cover at least the contact holes 45, 46. In turn, according to the conditions explained with reference to FIG. 3, ohmic contact and a Schottky barrier are formed in the contact hole 45 and the contact hole 46 respectively by heat treatment at 600° C. for several tens minute as annealing process for forming a Schottky barrier.

Figure 4K:
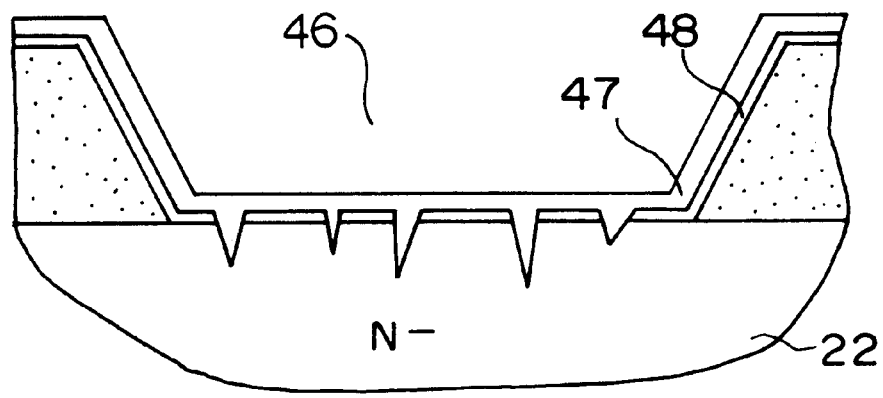

In this annealing process, as shown in FIG. 4K, it may be considered that the nickel layer 47 penetrates the titanium layer 48 in the contact hole 46 and is then alloyed with the N⁻ type layer 22 as the base layer like alloy spike. After annealing process, it seems that the boarder between the nickel layer 47 and the titanium layer 48 becomes vague since they are alloyed with each other. Since the N⁺ type source region 26 has sufficiently high surface concentration on the order of more than 10²⁰, good ohmic contact can be obtained in the contact hole 45 without alloy growing such as the alloy spike.

Figure 4L:
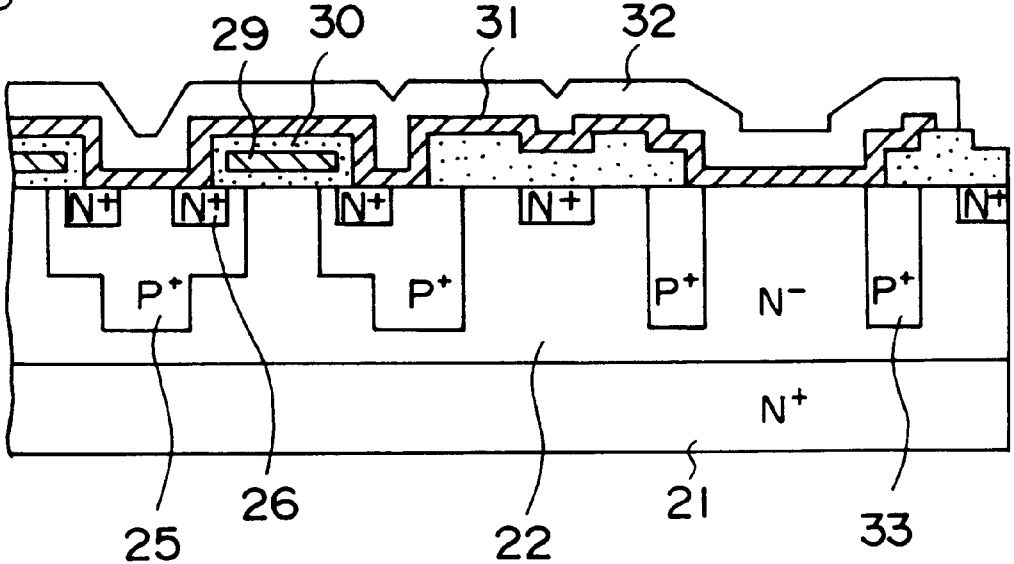

As shown in FIG. 4L, pure aluminum having a film thickness of several μm or aluminum/silicon including silicon by about 1 weight % is formed on the barrier metal 31 by the sputtering method. The pure aluminum or aluminum/silicon is then patterned to form a shape necessary for parallel connection of the MOS cells, as shown by a dotted line in FIG. 2B. Of course, the gate electrode pad 36 is included therein.

Figure 4M:
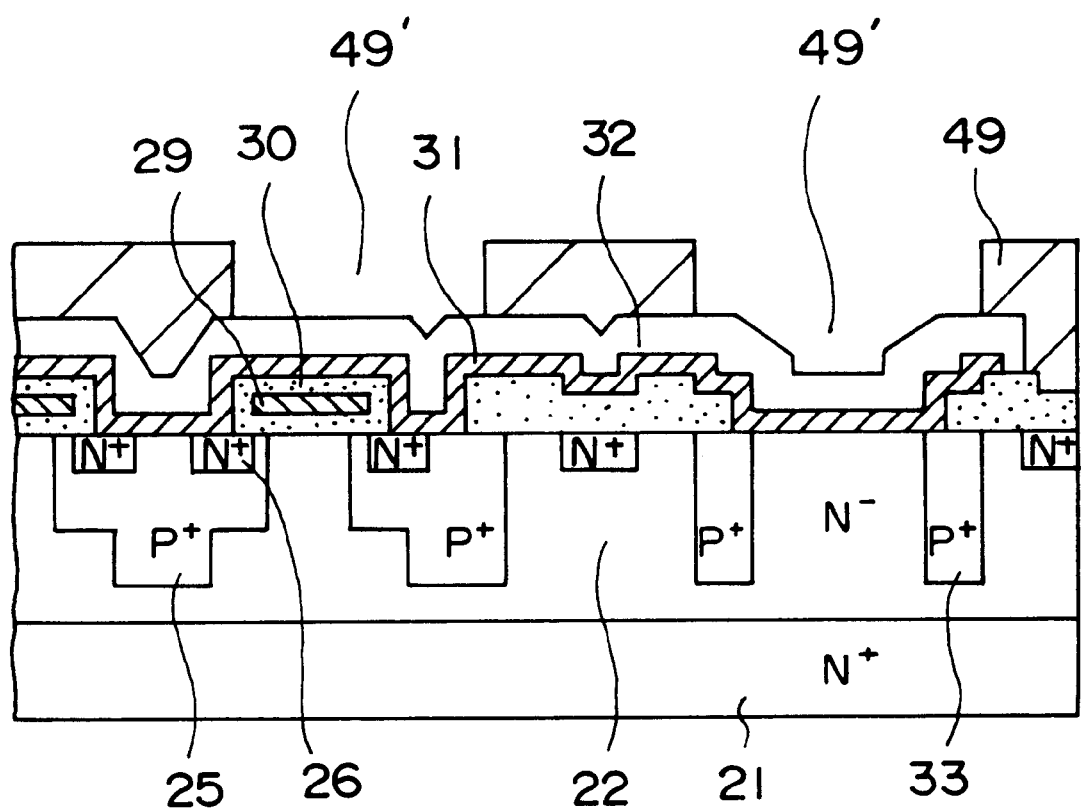

As shown in FIG. 4M, a silicon nitride film 49 is stacked on the all over surface of the resultant structure to have a film thickness of several μm. Openings 49' for forming electrode pads 36, 37, 38 are formed in the silicon nitride film 49, which results in a jacket coat film. With the above, wafer process of the chip has been terminated.

According to the manufacturing method described above, an advantage can be achieved that diffusion steps can be simplified since the P⁺ type base region 25 and the P⁺ type guard ring region 33 and the N⁺ type source region 26 and the N⁺ type channel stopper region 34 can be formed respectively by the same steps. If the P⁺ type guard ring region 33 is formed around Schottky junction, depletion layer formed in the N⁻ type layer 22 may function to form uniform electric field. To arrange a diffusion depth of the P⁺ type base region 25 in the MOSFET device 23 and a diffusion depth of the P⁺ type guard ring region 33 in the SBD device 24 to the same depth signifies to arrange breakdown voltages in the two devices to the same level.

Since the barrier metal 31 is formed in both the MOSFET device 23 and the SBD device 24 and a Schottky barrier and ohmic contact can be formed by annealing process with the barrier metal 31 being provided, annealing process (350 to 550° C.) for the aluminum electrode 32 formed on the barrier metal 31 can be omitted. In other words, heat treatment at a temperature in excess of the temperature of the annealing process can be eliminated following to annealing process for the barrier metal 31. Therefore, precipitation of phosphorus from the N⁺ type source region 26, as described, can be prevented and also low temperature manufacturing of the device is permitted throughout all manufacturing processes. Therefore, since the device is subjected to few thermal histories, impurities in the N⁺ type source region 26, etc. are scarcely rediffused. This leads to further miniaturization of the MOSFET device 23.

An example of mounted semiconductor chips formed by the above manufacturing steps will be explained hereinafter.

Figure 5A:
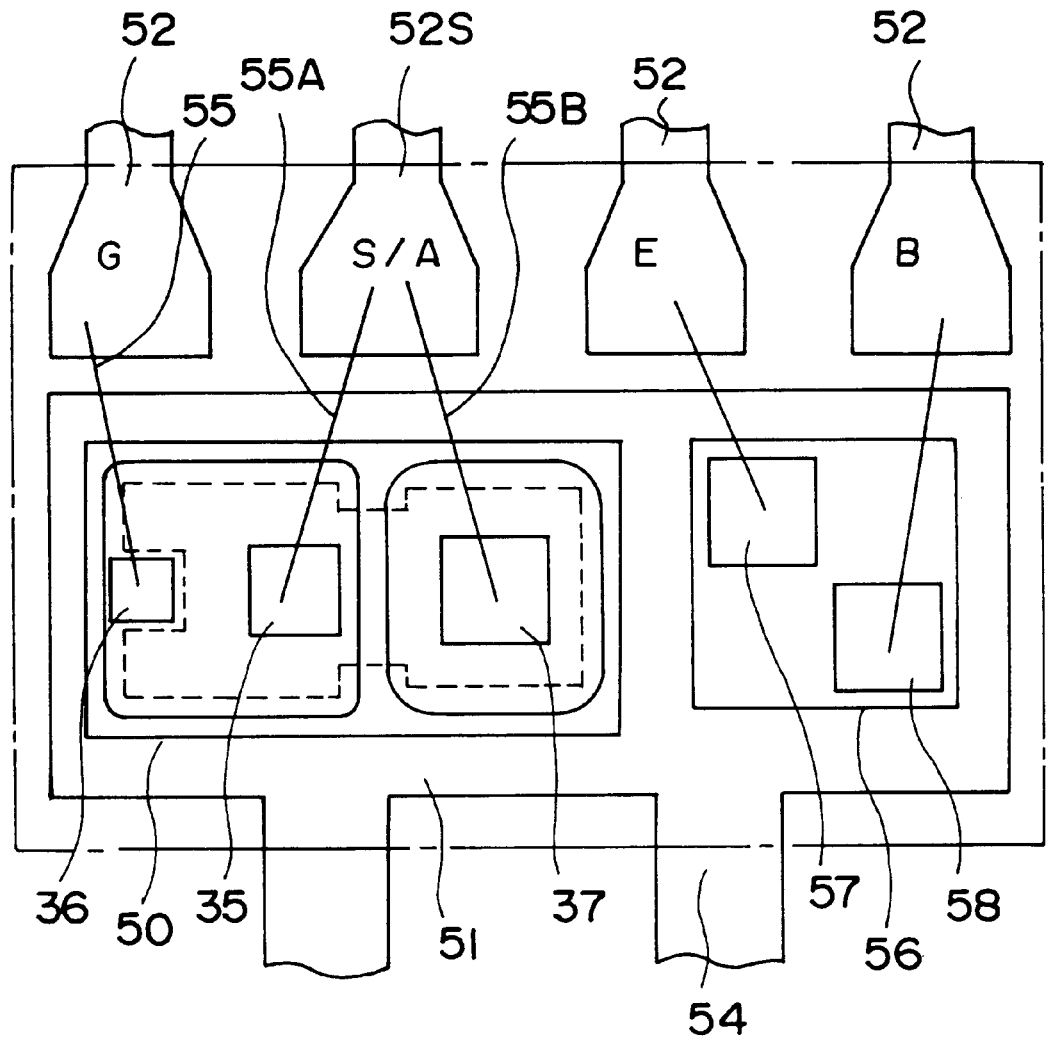
FIG. 5A is a plan view illustrating a mounting state of the semiconductor device according to the first embodiment of the present invention.
Figure 5B:
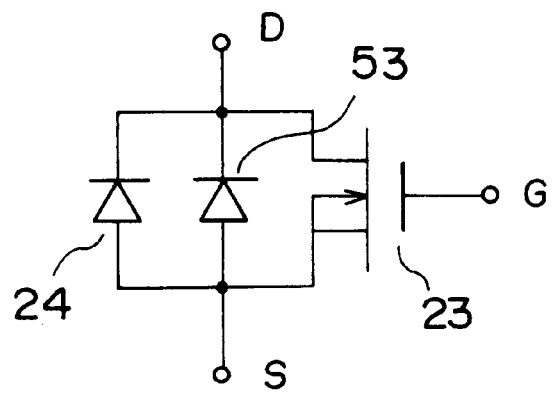
FIG. 5B is a diagram showing an equivalent circuit of the semiconductor device according to the first embodiment of the present invention.

FIG. 5A shows an example of a mounting state of the above semiconductor chip. A reference 50 denotes the above semiconductor chip; 51, island of a lead frame; and 52, external connection lead of the lead frame. In the semiconductor device shown in FIG. 2, the SBD device 24 are connected in parallel between the source region and the drain region of the MOSFET device 23, like a circuit shown in FIG. 5B. A reference 53 denotes the parasitic diode formed of P$^+$ type base region 25 and the N$^-$ type layer 22. The drain electrode of the semiconductor chip 50 is formed in the N$^+$ type layer side, and die-bonded on the island 51 by solder, silver paste, etc.

Therefore, either the island 51 itself serving as a radiation plate or the lead 54 connected to the island acts as the drain terminal and the cathode terminal. The gate electrode pad 36 and the corresponding external connection lead 52 are wire-bonded by a wire 55 to be electrically connected, and the source electrode pad 35 and the corresponding external connection lead 52S are wire-bonded by a wire 55A to be electrically connected. Further, the anode electrode pad 37 formed on the SBD region 24B and the source external connection lead 52S are wire-bonded by another wire 55B. To form the semiconductor device, a main portion (shown by a dot-dash line) including the semiconductor chip 50 and one tip portion of the lead 52 is plastic-sealed, and then opposite tip portion of the lead 52 is extended externally.

For purposes of electric connection only, one of wires 55A, 55B connecting the external connection lead 52S for the source may be omitted if the aluminum electrode 32 is connected to the source and the anode. However, it would be preferable that, because the source of the MOSFET device 23 is required to flow large current, parallel wire bonding using a plurality of wires is adopted, in many cases, to lower the electric resistance of the wire. Ultrasonic may be used for wire bonding, and great impact is applied to lower portion of the electrode pad by the ultrasonic. Therefore, if such impacts are applied plural times to the source electrode pad 35 formed on the MOS cell, defect probability of the MOS cell due to such impact (crack of the insulating film, destruction of the gate polysilicon or gate oxide film, and the like) will be enhanced correspondingly.

Many MOS cells are formed beneath the source electrode pad 35 while only the flat surface of the N$^-$ type layer 22 forming a Schottky barrier is formed beneath the anode electrode pad 37. Therefore, it may be considered that device destruction scarcely occurs because of impact applied to the anode electrode pad 37. In particular, such situation may be better understood if, as shown in FIG. 2B, the anode electrode pad 37 is smaller than the Schottky barrier area 70 and in addition it is located within the Schottky barrier area 70. For this reason, if the number of wire is increased to the anode electrode pad 37 which has few probability of defect generation, electric capacity of the source wire can be increased and electric resistance thereof can be reduced, without increasing fraction defective of the MOSFET device 23. If this concept will be further developed, wire bonding between the source and the external connection lead 52S can be substituted for the wire 55B used for wire bonding of the anode electrode pad 37, so that another embodiment can be easily thought out wherein wire bonding of the source electrode pad 35 is omitted.

Figure 1A:
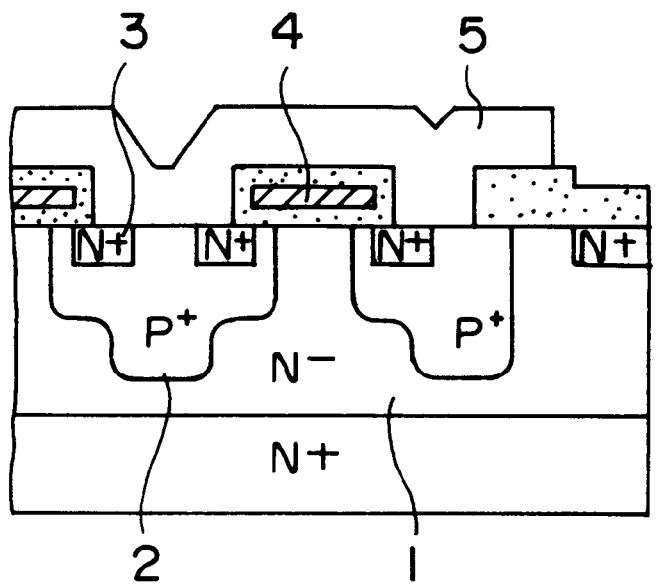
FIG. 1A is a sectional view showing a structure of the conventional vertical type power MOSFET device.
Figure 1B:
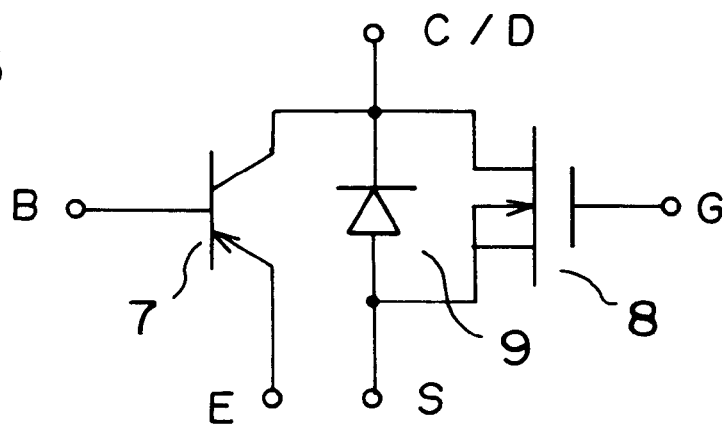
FIG. 1B is a first circuit diagram showing a switching device used in the conventional DC—DC converter.
Figure 1C:
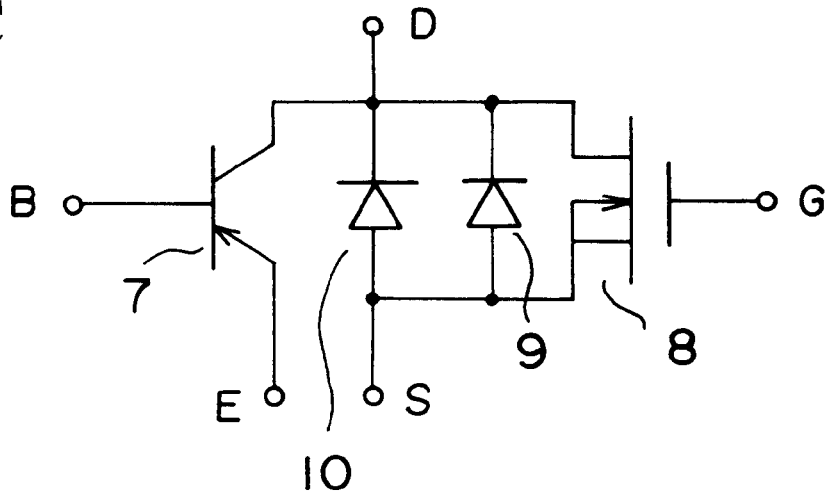
FIG. 1C is a second circuit diagram showing a switching device used in the conventional DC—DC converter.

Resin molding process encapsulating only one semiconductor chip 50 therein has been explained as above. Further development of this concept will yield still another embodiment described in the following. The circuit configuration explained in the conventional example in FIG. 1C has composed of the FET, the SBD device, and the bipolar transistor TR, and the drain of the FET and the collector of the PNP transistor are connected commonly.

Therefore, according to capability of the mounted package, as shown in FIG. 5A similarly, a transistor chip 56 may be die-bonded to the island 51 on which the chip 50 is die-bonded, then the emitter electrode pad 57 and the base bonding pad 58 formed on the chip 56 may be wire-bonded to the corresponding external connection leads 52, and then the chip 56 as well as the chip 50 may be resin-sealed to thus form one package device. As a result, the number of parts required for the device can be reduced.

The transistor chip 56 is so formed that first the N type base region is formed on a surface of the P$^-$ type layer of the P$^+$/P$^-$ substrate serving as the collector, then the P$^+$ type emitter region is formed on a surface of the N type base region, and then electrode pads 57, 58 connected to respective diffusion regions are formed on the aluminum electrode. As the result that the MOSFET device 23 and the SBD device 24 are formed as one chip, they can be thermally coupled more tightly than the case where they are formed as discrete chips. In this event, heat is transferred by thermal conduction via the silicon substrate 21, the island 51 of the lead frame, and the barrier metal 31/aluminum electrode 32.

The SBD device has a forward rising voltage VF of about –2 mV/°C. in the temperature characteristic, and it has the smaller forward rising voltage VF in the high temperature range. Hence, since, if the MOSFET device 23 and the BD device 24 are formed as one chip, heat generated by the MOSFET device 23 in its operation state transfers instantaneously to the SBD device 24 formed in the same chip to heat the SBD device 24, forward current flows through the parasitic diode 53 in the MOSFET device 23 and the SBD device 24. Even when the MOSFET device 23 is turned on thereafter, the forward voltage VF of the SBD device 24 can be still reduced because of heat generation of the MOSFET device 23, as described above, and as a result accumulated carriers in the MOSFET device 23 can be extracted in a moment to facilitate perfect shut-off. Therefore, even when forward current flows through the parasitic diode in the MOSFET device 23, high speed ON/OFF operation of the MOSFET device 23 can be achieved, so that an advantageous merit capable of effecting further high speed switching operation can be obtained in the circuit.

In addition, in the event that the MOSFET device 23 and the SBD device 24 are formed as one chip, the forward voltage VF of the SBD device 24 can be still reduced in an operation state of the MOSFET device 23, as described above. In case the SBD device 24 is used in the DC—DC circuit shown in FIG. 1C, for example, the current supplied from the coil (not shown) flows mainly through the SBD device 24 when the PNP transistor 7 is turned OFF. Therefore, reduction in power loss caused by the above current can suppressed to thus improve an efficiency. Besides, by forming the MOSFET device 23 and the SBD device 24 as one chip, the semiconductor device can be minimized in size, and it is especially effective for a miniaturized set.

In the meanwhile, in forming the MOSFET device 23 and the SBD device 24 as one chip, the barrier metal 31 must not be always formed over the N$^+$ type channel stopper region 34B. That is, the barrier metal 31 may be formed only on the contact portion. However, since the barrier metal such as nickel is not inferior in good thermal conductor to aluminum, sectional area of the metal for thermal conduction can be increased if the barrier metal is formed so as to traverse the upper portion of the N$^+$ type channel stopper region 34B, like the pattern of the aluminum electrode 32 shown by a dotted line in FIG. 2A. As a result, it is advantageous to employ the temperature characteristic of the SBD device 24. Silicon is inferior to the metal in thermal conductivity.

Next, attention will be paid to a line width of the barrier metal when it traverses over the N+ type channel stopper region 34B. In other words, it is more advantageous in thermal conduction if the line width is formed wider. Accordingly, it would be effective if the barrier metal is formed to have a possible wider line width, e.g., a line width being wider than the width of the electrode pads 35, 37.

In turn, attention will be directed to a distance between the MOSFET device 23 and the SBD device 24. In the configuration in FIG. 2, the N+ type channel stopper region 34B is formed between the MOSFET device 23 and the SBD device 24. This region is formed to suppress the parasitic transistor which is made up of the P+ type base region 25 serving as the emitter or the collector, the N− type layer 22 serving as the base, and the P+ type guard ring region 33 serving as the collector or the emitter.

That is to say, the distance between the MOSFET device 23 and the SBD device 24 can be narrowed by arranging the N+ type channel stopper region 34B therebetween. It is of course that the thermal coupling can be more effectively enhanced if the distance becomes short.

In the above device, impurity concentration of the N− type layer 22 such as less than $3 \times 10^{16}/cm^3$ is determined according to the request issued from the SBD device 24 side. Therefore, a second embodiment of the present invention will be explained hereinafter wherein further severe request for the characteristic is issued to the MOSFET device 23 side to reduce ON-state resistance still more.

Figure 6:
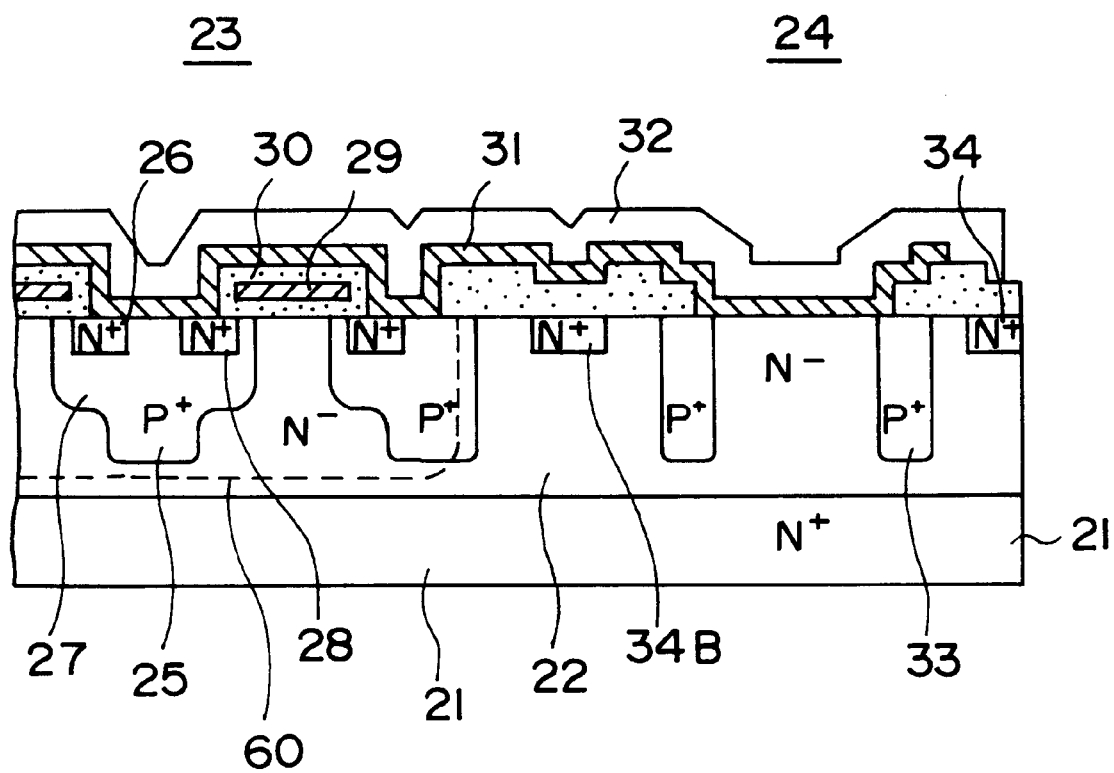
FIG. 6 is a sectional view showing another semiconductor device according to a second embodiment of the present invention.

As shown in FIG. 6, according to the second embodiment of the present invention, an N− type well region 60 is formed selectively in the MOSFET device 23 forming region. Since other portions of the device are identical to those in FIG. 1, their explanations will be omitted by allocating the same reference symbols to these other portions.

The N− type well region 60 is formed to increase impurity concentration in the N− type layer 22. Since the N− type well region 60 is formed to reduce ON-state resistance, it must be formed within the N− type layer 22 surrounded by the P+ type base region 25 acting as a current path of the drain current, which is usually called as a πregion. Since a diffusion depth is determined depending upon the breakdown voltage, if the breakdown voltage is low, it can be formed considerably deep, for example, deeper than the P+ type base region 25 and further deeper to reach the N− type layer. On the contrary, if the breakdown voltage is high, it would be formed shallower than the P+ type base region 25. Since impurity concentration in the N− type well region 60 is high rather than the N− type layer 22, resistance component in the region serving as the drain current path can be reduced and therefore the ON-state resistance of the MOSFET device 23 can be decreased. But it is preferable not making the N− type well region 60.

In the SBD device 24, a Schottky barrier can be readily obtained by low impurity concentration of the N type layer 22 since the N− type well region 60 is not formed. Moreover, because impurity concentration of the N− type layer 22 can be further decreased by the N− type well region 60, a Schottky barrier can be readily obtained at further low temperature. If there is caused no trouble in the MOSFET device 23 side, the barrier metal 31 may be removed from the source contact hole of the MOSFET device 23 so as to make ohmic contact with the aluminum electrode 32.

Subsequently, the structure shown in FIG. 6 can be accomplished by the manufacturing method described hereinbelow.

Figure 7A:
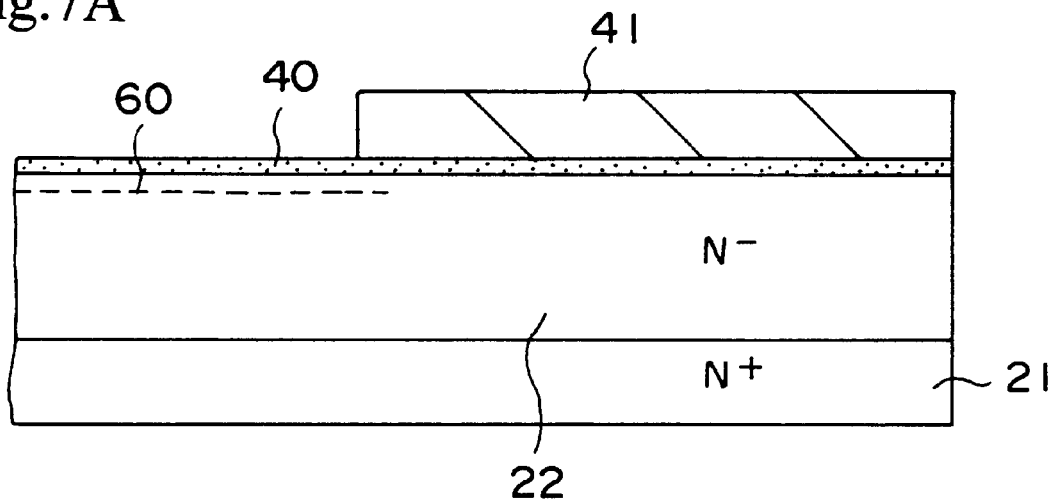
FIGS. 7A to 7C are sectional views illustrating a manufacturing method of the another semiconductor device according to the second embodiment of the present invention.

As shown in FIG. 7A, first an oxide film 40 is formed by thermally oxidizing a surface of the N type layer 22 of the N+/N− substrate 21, then a photoresist layer 61 is formed thereon, and then the N− type well region 60 is formed by ion-implanting phosphorus ions into the MOSFET device 23 forming region using the photoresist layer 61 as a mask.

Figure 7B:
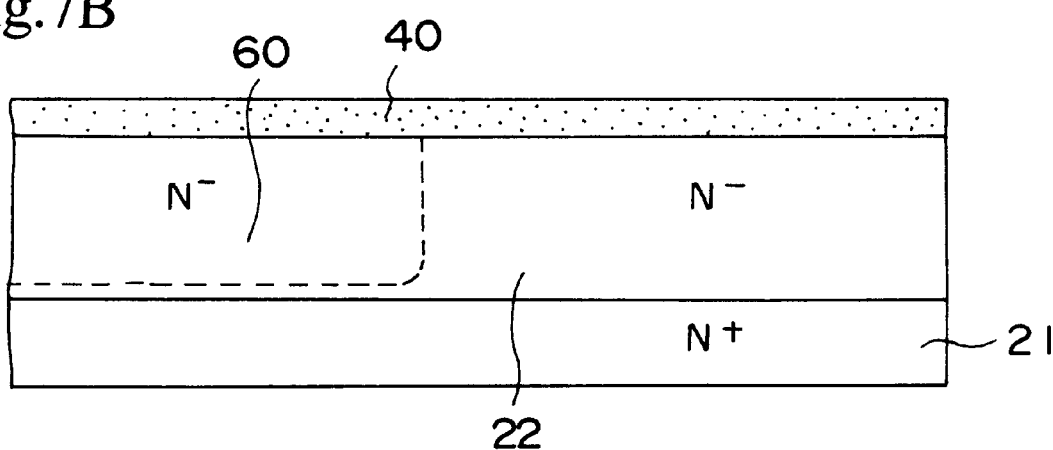

Next, as shown in FIG. 7B, the N− type well region 60 is expanded and diffused up to a required diffusion depth by processing the all over substrate 21 by means of heat treatment. At the same time, a thermal oxide film 40 on a surface of the N− type layer 22 is also grown.

Figure 7C:
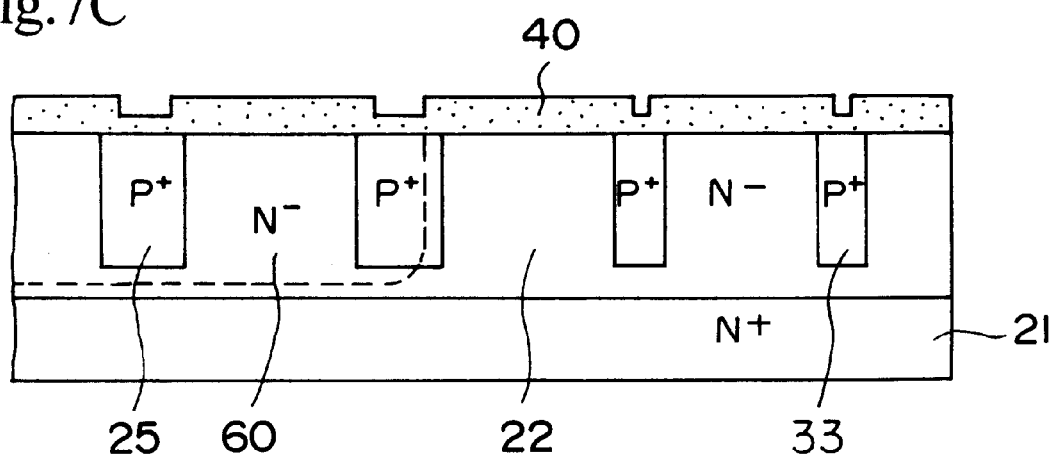

As shown in FIG. 7C, a resist mask is formed on the oxide film 40, then an opening is formed by etching the oxide film 40, then boron ions are selectively diffused via the opening, and then the P+ type base region 25 and the P+ type guard ring region 33 are formed by thermal diffusion. The manufacturing steps in FIG. 7C correspond to those in FIG. 4A, but succeeding manufacturing steps are similar to those in FIGS. 4B to 4M and thus their explanations will be omitted for the sake of simplicity. If the N− type well region 60 is formed in this manner, impurity concentration of the N− type layer 22 can be further reduced (for example, on the order of $1 \times 10^{16}$ cm$^3$), low temperature processing, for example, the annealing step for a Schottky barrier at 450° C., can be accomplished.

The semiconductor device according to the present invention comprises the MOSFET device 23 and the SBD device 24 in one chip in combination. Although the drain and the cathode are connected with the N− type layer 22 and are inseparable, the source and the anode are connected in parallel by the aluminum electrode 32. Therefore, the circuit configuration wherein the source and the anode are separated can be readily implemented only by varying the pattern of the aluminum electrode 32.

Figure 8A:
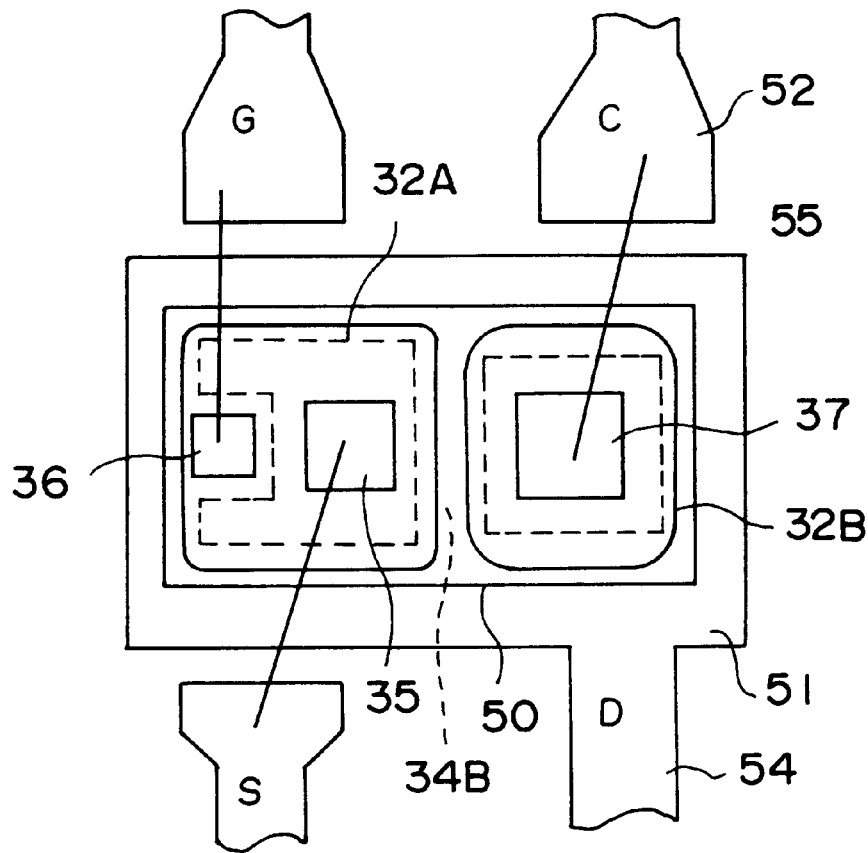
FIG. 8A is a plan view illustrating a mounting state of the another semiconductor device according to the second embodiment of the present invention.
Figure 8B:
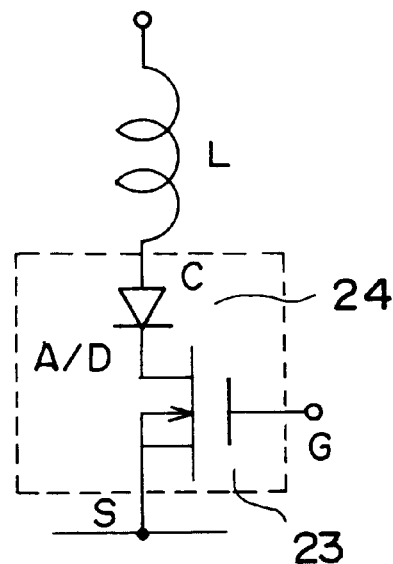
FIG. 8B is a circuit diagram showing a half-wave rectifier circuit using the semiconductor device according to the second embodiment of the present invention.

As shown in FIG. 8A, the semiconductor device is basically similar to the structure shown in FIG. 2. The pattern of the aluminum electrode 32 (including the barrier metal 31) is disconnected over the channel stopper region 34B to form the source electrode 32A and the anode electrode 32B respectively. Remaining assembly structures are similar to those in FIG. 5, and their explanation will be omitted by allocating the same reference symbols to theses structures.

FIG. 8A shows a half-wave current resonance circuit in which the semiconductor device described above is used, and an area indicated by a dotted line correspond to the semiconductor device in FIG. 8A. The anode of the SBD device 24 is connected to one end of the coil load L, then the cathode of the SBD device 24 is connected to the drain of the MOSFET device 23 via the N+/N− substrate 21 and the island 51 of the lead frame, and then the source is connected to ground. The half-wave current resonance circuit may only flow forward resonance current, and it may be used as a reverse blocking diode in the SBD device 24 so as to prevent operation of the parasitic diode in the MOSFET device 23 completely. Like the above, such composite device can be simply manufactured only by changing the pattern of the aluminum electrode 32.

What is claimed is:

1. A method of manufacturing a semiconductor device comprising the steps of:

forming a semiconductor layer having a first conductivity type on a semiconductor substrate having the first conductivity type, said semiconductor layer having an impurity concentration of less than $3 \times 10^{16}/cm^3$, and a part of said semiconductor layer serving as a drain region;

forming a plurality of base regions having a second conductivity type in said semiconductor layer along a surface thereof;

forming a source region having the first conductivity type in each of said base regions along a surface thereof by diffusing phosphorus or arsenic;

forming a gate insulating layer on said base regions at least between said source region and said drain region;

forming a gate electrode at least on said gate insulating layer;

forming an insulating layer covering said semiconductor layer;

forming a contact hole for a source electrode to expose said source region and said base region, and a contact hole for a Schottky barrier diode to expose a surface of said semiconductor layer by selectively removing said insulating layer;

forming a barrier metal on an entire surface of a resultant structure, forming selectively said barrier metal contacting to both said source region and said base region via said contact hole for said source electrode by patterning said barrier metal, and simultaneously forming said barrier metal contacting to said semiconductor layer via said contact hole for said Schottky barrier diode;

heating an entire resultant structure at a temperature of less than 700° C. so as to make a Schottky barrier with said barrier metal formed in said contact hole for said Schottky barrier diode and said semiconductor layer; and depositing aluminum material on said barrier metal and forming an electrode wiring by patterning said aluminum material.

2. A method of manufacturing a semiconductor device comprising the steps of:

forming a semiconductor layer of a first conductivity type on a semiconductor substrate of the first type, said semiconductor layer having an impurity concentration of less than $3 \times 10^{16}/cm^3$, a part of said semiconductor layer serving as a drain region;

forming a well layer of the first conductivity type having a higher impurity concentration than that of the semiconductor layer on a surface of said semiconductor layer;

forming a plurality of base regions having a second conductivity type in said well layer along thereof by diffusing phosphorus or arsenic;

forming a source region having the first conductivity type in said base regions along a surface thereof;

forming a gate insulating layer on said base regions at least between said source region and said drain region;

forming a gate electrode at least on said gate insulating layer;

forming an insulating layer covering said semiconductor layer;

forming a contact hole for a source electrode to expose said source region and said base region, and a contact hole for a Schottky barrier diode to expose a surface of said semiconductor layer by selectively removing said insulating layer;

forming a barrier metal on an entire surface of a resultant structure, forming selectively said barrier metal contacting to both said source region and said base region via said contact hole for said source electrode by patterning said barrier metal, and simultaneously forming said barrier metal contacting to said semiconductor layer via said contact hole for said Schottky barrier diode;

heating an entire resultant structure at a temperature of less than 700° C. so as to make a Schottky barrier with said barrier metal formed in said contact hole for said Schottky barrier diode and said one conductivity type semiconductor layer; and depositing aluminum material on said barrier metal and forming an electrode wiring by patterning said aluminum material.

* * * * *